US012568764B2

(12) United States Patent　　　(10) Patent No.:　US 12,568,764 B2
Ikeuchi et al.　　　　　　　　　　(45) Date of Patent:　　Mar. 3, 2026

(54) PIEZOELECTRIC DEVICE

(71) Applicant: Murata Manufacturing Co., Ltd., Nagaokakyo (JP)

(72) Inventors: Shinsuke Ikeuchi, Nagaokakyo (JP); Seiji Umezawa, Nagaokakyo (JP); Fumiya Kurokawa, Nagaokakyo (JP); Masayuki Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 988 days.

(21) Appl. No.: 17/724,528

(22) Filed: Apr. 20, 2022

(65) Prior Publication Data

US 2022/0246830 A1　Aug. 4, 2022

Related U.S. Application Data

(63) Continuation of application No. PCT/JP2020/027587, filed on Jul. 16, 2020.

(30) Foreign Application Priority Data

Nov. 25, 2019　(JP) ................................. 2019-212042

(51) Int. Cl.
　　*H01L 41/09*　　　(2006.01)
　　*H10N 30/20*　　　(2023.01)
　　*H10N 30/87*　　　(2023.01)
(52) U.S. Cl.
　　CPC ..... *H10N 30/2042* (2023.02); *H10N 30/2027* (2023.02); *H10N 30/877* (2023.02)

(58) Field of Classification Search
　　CPC ...................... H10N 30/2042; H10N 30/2027
　　See application file for complete search history.

(56) References Cited

U.S. PATENT DOCUMENTS 5,633,552 A　　5/1997　Lee et al.
2012/0250909 A1　10/2012　Grosh et al.
2013/0038176 A1*　2/2013　Horikiri ............... H10N 30/877
　　　　　　　　　　　　　　　　　　　　　　216/13

(Continued)

FOREIGN PATENT DOCUMENTS

JP　　2008-283529 A　　11/2008
JP　　2014-515214 A　　6/2014

(Continued)

OTHER PUBLICATIONS

English Translation of JP 2015068704 (Year: 2015).*

(Continued)

*Primary Examiner* — Bryan P Gordon
(74) *Attorney, Agent, or Firm* — Keating & Bennett, LLP

(57)　　　　　ABSTRACT

In a piezoelectric device, a cantilever portion includes a fixed edge portion and a free edge portion. A plate-shaped portion includes a facing edge portion, a support edge portion, a first lateral support edge portion, and a second lateral support edge portion. The facing edge portion faces the free edge portion. The support edge portion is on an opposite side from the facing edge portion in an extension direction of the cantilever portion. The plate-shaped portion is connected to an inner surface at at least a portion of the support edge portion, at least a portion of the first lateral support edge portion, and at least a portion of the second lateral support edge portion.

19 Claims, 6 Drawing Sheets

(56)                References Cited

U.S. PATENT DOCUMENTS

| | | | |
|---|---|---|---|
| 2013/0043959 A1* | 2/2013 | Ishii | H03H 9/0542 |
| | | | 331/158 |
| 2018/0188212 A1 | 7/2018 | Ono et al. | |
| 2020/0191687 A1* | 6/2020 | Shinjo | H10N 30/802 |
| 2022/0246830 A1* | 8/2022 | Ikeuchi | H04R 17/00 |

FOREIGN PATENT DOCUMENTS

| | | | |
|---|---|---|---|
| JP | 2014-173988 A | 9/2014 | |
| JP | 2015-068704 A | 4/2015 | |
| JP | 2017-041824 A | 2/2017 | |

OTHER PUBLICATIONS

English Translation of JP 2014173988 (Year: 2014).*
Official Communication issued in International Patent Application
No. PCT/JP2020/027587, mailed on Oct. 6, 2020.

* cited by examiner

FIG.2
III
133
60
10
20
120
121
30
70
111    134
III
132
102
130
110(112)
122
131
FIG.3
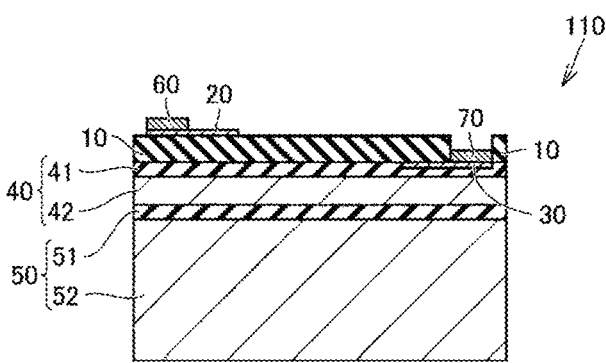
110
60  20
10
40 { 41
     42
50 { 51
     52
70
10
30
FIG.4
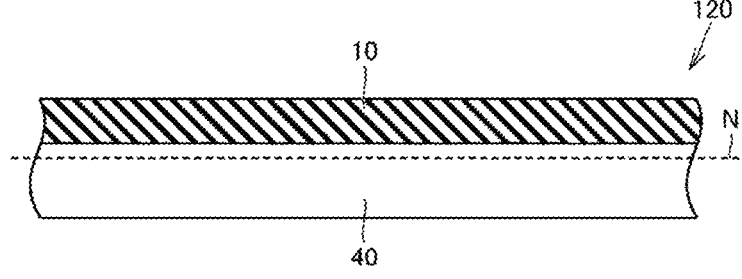
120
10
N
40

FIG.12
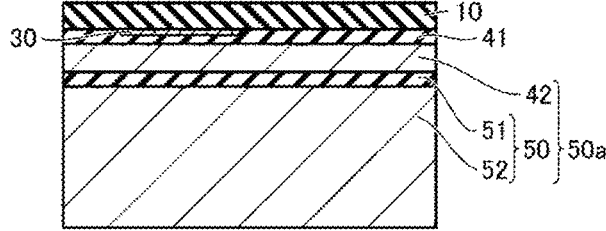
FIG.13
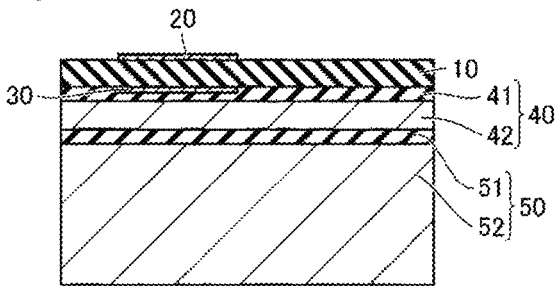
FIG.14
FIG.15
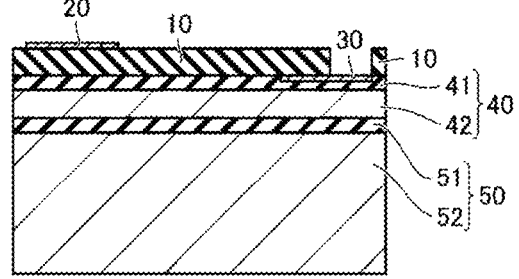

PIEZOELECTRIC DEVICE

CROSS REFERENCE TO RELATED APPLICATIONS

This application claims the benefit of priority to Japanese Patent Application No. 2019-212042 filed on Nov. 25, 2019 and is a Continuation Application of PCT Application No. PCT/JP2020/027587 filed on Jul. 16, 2020. The entire contents of each application are hereby incorporated herein by reference.

BACKGROUND OF THE INVENTION

1. Field of the Invention

The present invention relates to piezoelectric devices.

2. Description of the Related Art

Japanese Unexamined Patent Application Publication No. 2014-515214, U.S. Pat. No. 5,633,552, and Japanese Unexamined Patent Application Publication No. 2017-041824 disclose the configurations of piezoelectric devices.

The piezoelectric device disclosed in Japanese Unexamined Patent Application Publication No. 2014-515214 is a MEMS transducer and includes a substrate and a plurality of cantilevers. The cantilevers are tapered and are adjacent to each other. Each cantilever defines a beam base end portion, a beam tip end portion, and a beam body. The beam body is disposed between the beam base end portion and the beam tip end portion. The cantilevers are disposed so that their beam tip end portions extend to a common virtual point. The cantilevers are coupled to a substrate along the beam base end portions but are not coupled to the substrate along the beam bodies.

The piezoelectric device disclosed in U.S. Pat. No. 5,633, 552 is a micromechanical device and includes a frame and at least one cantilever structure. The frame has an opening. The cantilever structure is attached to the frame along a portion of a periphery of the opening. The cantilever structure covers most of the opening. The cantilever structure includes three sub-layers. The three sub-layers include a first sub-layer, a second sub-layer, and a third sub-layer. The second sub-layer is adjacent to the first sub-layer and the third sub-layer. The first sub-layer and the third sub-layer are formed of substantially the same first material and have substantially the same average stress. The second sub-layer is formed of a second material and has a minimum stress and a maximum stress. The difference between the maximum stress and the minimum stress is smaller than the magnitude of the average stress of the first sub-layer. The opening may have a square shape.

The piezoelectric device disclosed in Japanese Unexamined Patent Application Publication No. 2017-041824 is a detection device that detects acoustic waves propagating through the air and has a cantilever structure. The cantilever structure has a fixed end and a free end. The cantilever structure includes a first electrode and a second electrode. The first electrode has a plate-like shape and vibrates in response to being bent by acoustic waves. The second electrode has a plate-like shape and faces the first electrode with a prescribed distance therebetween. The cantilever structure detects the acoustic waves on the basis of changes in an electrostatic capacitance between the first electrode and the second electrode. An edge of the second electrode, in the direction from the fixed end to the free end, is located nearer the fixed end side than the free end side is.

SUMMARY OF THE INVENTION

The piezoelectric device disclosed in Japanese Unexamined Patent Application Publication No. 2014-515214 includes a plurality of cantilevers. When the piezoelectric device is driven, the plurality of cantilevers may vibrate with different phases from each other. In this case, the device characteristics of the piezoelectric device will be degraded. The piezoelectric devices disclosed in U.S. Pat. No. 5,633, 552 and Japanese Unexamined Patent Application Publication No. 2017-041824 each include one cantilever structure, i.e., a cantilever part. However, a piezoelectric device that has only one beam has lower device characteristics because the force with which the medium around the beam is pushed out is smaller than that in the case of a piezoelectric device having a plurality of beams.

In the piezoelectric devices of the related art, the medium around the beam is caused to vibrate by the beam vibrating. Then, the vibration of the medium is caused to resonate in the space on the side near the opening surrounded by the frame, i.e., the base part and the cantilever part, and as a result, the vibration of the medium is amplified. Thus, one method of improving the device characteristics of a piezoelectric device is a method in which the vibration of a medium is caused to resonate in a space on the side near an opening.

In order to cause the vibration of the medium to resonate in a space on the side near the opening, it is necessary to make the resonant frequency of the medium on the side near the opening close to the frequency of ultrasonic waves generated or detected by the piezoelectric device. The resonant frequency of the medium in the space on the side near the opening can be appropriately changed by adjusting the volume of the space on the side near the opening. One method of adjusting the volume of the space on the side near the opening is a method in which the length of the beam in the extension direction of the beam is changed. However, when the extension-direction length of the beam is changed, the resonant frequency of the beam also changes. When the difference between the resonant frequency of the beam and the frequency of ultrasonic waves generated or detected by the piezoelectric device is large, the device characteristics of the piezoelectric device are degraded.

Preferred embodiments of the present invention provide piezoelectric devices each having only one beam in which the resonant frequency of a medium around the beam can be easily controlled while reducing or preventing changes in the resonant frequency of the beam.

A piezoelectric device according to a preferred embodiment of the present invention includes a base portion, only one cantilever portion, and a plate-shaped portion. The base portion has an annular shape and includes an inner surface, a first surface, and a second surface. The inner surface is located on an inner side of the annular shape. The first surface is located on one side in an axial direction of a center axis of the annular shape. The second surface is located on an opposite side in the axial direction from the first surface. The cantilever portion is connected to a portion of the inner surface of the base portion at a position separated from the second surface. The cantilever portion extends in an in-plane direction that intersects the axial direction of the center axis. The cantilever portion includes a fixed edge portion and a free edge portion. The fixed edge portion is connected to the inner surface. The free edge portion is located on an opposite side of the cantilever portion from the fixed edge portion in an extension direction of the cantilever portion. The cantilever portion includes a piezoelectric layer, a first electrode layer, and a second electrode layer. The first electrode layer is on one side of the piezoelectric layer in the axial direction of the center axis. The second electrode layer is faces at least a portion of the first electrode layer across the piezoelectric layer. The plate-shaped portion is connected to another portion of the inner surface of the base portion at a position separated from the second surface. The plate-shaped portion extends in the in-plane direction so as to face the cantilever portion with a gap therebetween. The plate-shaped portion includes a facing edge portion, a support edge portion, a first lateral support edge portion, and a second lateral support edge portion. The facing edge portion faces the free edge portion. The support edge portion is located on an opposite side from the facing edge portion in the extension direction of the cantilever portion. The first lateral support edge portion connects one end of the facing edge portion to the support edge portion when looking in the axial direction of the center axis. The second lateral support edge portion connects the other end of the facing edge portion to the support edge portion when looking in the axial direction of the center axis. The plate-shaped portion is connected to the inner surface at at least a portion of the support edge portion, at least a portion of the first lateral support edge portion, and at least a portion of the second lateral support edge portion.

According to preferred embodiments of the present invention, in a piezoelectric device including only one beam, the resonant frequency of a medium around the beam can be easily controlled while reducing or preventing changes in the resonant frequency of the beam.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a partial plan view in which the piezoelectric device in FIG. 1 is viewed in a direction along the arrows of line II-II.

FIG. 3 is a sectional view in which a portion of the piezoelectric device in FIG. 2 is viewed in a direction along the arrows of line III-III.

FIG. 4 is a sectional view schematically illustrating a portion of a cantilever portion of the piezoelectric device according to Preferred Embodiment 1 of the present invention.

FIG. 12 is a sectional view illustrating a state in which the piezoelectric single crystal substrate is ground down to form a piezoelectric layer in the method of manufacturing the piezoelectric device according to Preferred Embodiment 1 of the present invention.

FIG. 13 is a sectional view illustrating a state in which a first electrode layer is provided on the piezoelectric layer in the method of manufacturing the piezoelectric device according to Preferred Embodiment 1 of the present invention.

FIG. 14 is a sectional view illustrating a state in which a slit extending from the opposite side of the piezoelectric layer from the side near the support layer up to the upper surface of the substrate layer is formed in the method of manufacturing the piezoelectric device according to Preferred Embodiment 1 of the present invention.

FIG. 15 is a sectional view illustrating a state in which a through hole extending from the opposite side of the piezoelectric layer from the side near the support layer up to the upper surface of the second electrode layer is formed in the method of manufacturing the piezoelectric device according to Preferred Embodiment 1 of the present invention.

DETAILED DESCRIPTION OF THE PREFERRED EMBODIMENTS

Figure 1:
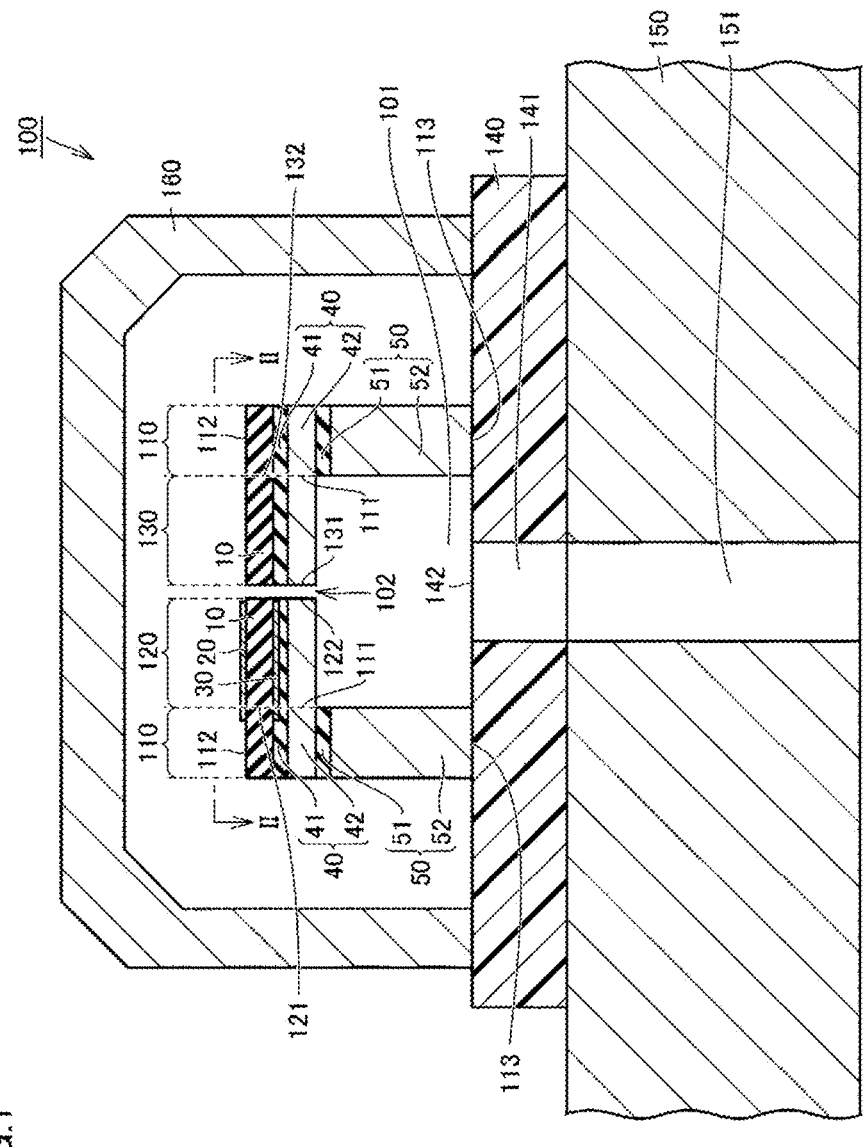
FIG. 1 is a sectional view illustrating a piezoelectric device according to Preferred Embodiment 1 of the present invention.

Hereafter, piezoelectric devices according to preferred embodiments of the present invention will be described while referring to the drawings. In the following description of the preferred embodiments, identical or equivalent elements or features in the drawings are denoted by the same symbols and repeated description thereof is omitted.

Preferred Embodiment 1

FIG. 1 is a sectional view illustrating a piezoelectric device according to Preferred Embodiment 1 of the present invention. FIG. 2 is a partial plan view in which the piezoelectric device in FIG. 1 is viewed in a direction along the arrows of line II-II. FIG. 3 is a sectional view in which a portion of the piezoelectric device in FIG. 2 is viewed in a direction along the arrows of line III-III.

As illustrated in FIGS. 1 to 3, a piezoelectric device 100 according to Preferred Embodiment 1 of the present invention includes a base portion 110, only one cantilever portion 120, a plate-shaped portion 130, a mounting substrate 140, and a casing 150.

As illustrated in FIGS. 1 and 2, the base portion 110 has an annular shape and includes an inner surface 111, a first surface 112, and a second surface 113.

The inner surface 111 is located on an inner side of the annular shape. The first surface 112 is located on one side in an axial direction of the center axis of the annular shape. The second surface 113 is located on the opposite side in the axial direction from the first surface 112. The specific portions of the base portion 110 will be described later.

The cantilever portion 120 is connected to a portion of the inner surface 111 of the base portion 110 at a position separated from the second surface 113. In this preferred embodiment, the cantilever portion 120 is connected to a portion of the inner surface 111 of the base portion 110 at the side nearer the first surface 112. The cantilever portion 120 extends in an in-plane direction that intersects an axial direction of the center axis.

The cantilever portion 120 includes a fixed edge portion 121 and a free edge portion 122. The fixed edge portion 121 is connected to the inner surface 111. The free edge portion 122 is located on the opposite side of the cantilever portion 120 from the side where the fixed edge portion 121 is located in the extension direction of the cantilever portion 120.

In this preferred embodiment, the cantilever portion 120 has a rectangular outer shape when viewed in the axial direction of the center axis. The cantilever portion 120 may instead have another outer shape such as a triangular shape, a trapezoidal shape, a semicircular shape when viewed in the axial direction of the center axis.

In this preferred embodiment, the maximum length of the cantilever portion 120 in the extension direction of the cantilever portion 120 is smaller than the length of the fixed edge portion 121 when looking in the axial direction of the center axis and smaller than the length of the free edge portion 122 when looking in the axial direction of the center axis. Furthermore, in Preferred Embodiment 1 of the present invention, the maximum length dimension of the cantilever portion 120 in the extension direction of the cantilever portion 120 is preferably at least about five times or more the thickness dimension of the cantilever portion 120 in the axial direction of the center axis from the viewpoint of making it easier for the cantilever portion 120 to undergo bending vibration. In other words, the thickness dimension of the piezoelectric device 100 illustrated in FIGS. 1 and 3 in the axial direction of the center axis is illustrated in a schematic manner.

As illustrated in FIG. 1, in this preferred embodiment, the cantilever portion 120 includes a piezoelectric layer 10, a first electrode layer 20, and a second electrode layer 30.

The piezoelectric layer 10 is made of a single crystal material. The cut angle of the piezoelectric layer 10 is appropriately selected so as to realize the desired device characteristics. In this preferred embodiment, the piezoelectric layer 10 includes a single crystal substrate and preferably is a rotated Y cut substrate. Furthermore, the cut angle of the rotated Y cut substrate is preferably about 30°. In addition, the thickness of the piezoelectric layer 10 is, for example, from about 0.3 μm to about 5.0 μm.

The material of the piezoelectric layer 10 is appropriately selected so that the piezoelectric device 100 realizes the desired device characteristics. In this preferred embodiment, the piezoelectric layer 10 is made of an inorganic material. Specifically, the piezoelectric layer 10 is made of an alkali-niobate-based compound or an alkali-tantalate-based compound. In this preferred embodiment, the alkali metal contained in the above-mentioned alkali-niobate-based compound or alkali-tantalate-based compound includes at least one out of lithium, sodium, and potassium. In this preferred embodiment, the piezoelectric layer 10 includes lithium niobate ($LiNbO_3$) or lithium tantalate ($LiTaO_3$).

The first electrode layer 20 is disposed on one side of the piezoelectric layer 10 in the axial direction of the center axis in at least the cantilever portion 120. The second electrode layer 30 is disposed so as to face at least a portion of the first electrode layer 20 with the piezoelectric layer 10 interposed therebetween in at least the cantilever portion 120. Furthermore, in this preferred embodiment, adhesive layers, which are not illustrated, are disposed between the first electrode layer 20 and the piezoelectric layer 10 and between the second electrode layer 30 and the piezoelectric layer 10.

In this preferred embodiment, the first electrode layer 20 and the second electrode layer 30 are made of Pt. The first electrode layer 20 and the second electrode layer 30 may be made of another material such as Al. The adhesive layers are made of Ti. The adhesive layers may be made of another material such as NiCr. The first electrode layer 20, the second electrode layer 30, and the adhesive layers may be epitaxially grown films. When the piezoelectric layer 10 includes lithium niobate ($LiNbO_3$), the adhesive layers are preferably made of NiCr from the viewpoint of reducing or preventing diffusion of the material of the adhesive layers into the first electrode layer 20 or the second electrode layer 30. This improves the reliability of the piezoelectric device 100.

In this preferred embodiment, the thickness of each of the first electrode layer 20 and the second electrode layer 30 is, for example, from about 0.05 μm to about 0.2 μm. The thickness of each adhesive layer is, for example, from about 0.005 μm to about 0.05 μm.

As illustrated in FIG. 1, in this preferred embodiment, the cantilever portion 120 further includes a support layer 40. The support layer 40 is disposed on the side of the piezoelectric layer 10 nearer the second surface 113 and on the side of the second electrode layer 30 nearer the second surface 113 in the axial direction of the center axis. The support layer 40 includes a first support layer 41 and a second support layer 42, which is stacked on the side of the first support layer 41 nearer the second surface 113 in the axial direction of the center axis. In this preferred embodiment, the first support layer 41 includes $SiO_2$ and the second support layer 42 includes single crystal Si. In this preferred embodiment, the thickness of the support layer 40 is preferably greater than the thickness of the piezoelectric layer from the viewpoint of facilitating bending vibration of the cantilever portion 120. The mechanism of bending vibration of the cantilever portion 120 will be described later.

As illustrated in FIGS. 1 and 2, the plate-shaped portion 130 is connected to another portion of the inner surface 111 of the base portion 110 at a position separated from the second surface 113. In this preferred embodiment, the plate-shaped portion 130 is connected to another portion of the inner surface 111 of the base portion 110 at the side nearer the first surface 112.

The plate-shaped portion 130 extends in the in-plane direction so as to face the cantilever portion 120 with a gap therebetween. From the viewpoint of increasing the bending rigidity of the plate-shaped portion 130, the area of the plate-shaped portion 130 is preferably as small as possible when looking in the axial direction of the center axis. The area of the plate-shaped portion 130 is less than or equal to the area of the cantilever portion 120 when looking in the axial direction of the center axis.

In this preferred embodiment, the area of the plate-shaped portion 130 is greater than or equal to about 10% of the area of the cantilever portion 120 when looking in the axial direction of the center axis. Looking in the axial direction of the center axis, the area of the plate-shaped portion 130 is preferably greater than or equal to about 20% of the area of the cantilever portion 120 and more preferably greater than or equal to about 30% of the area of the cantilever portion 120.

As illustrated in FIGS. 1 and 2, the plate-shaped portion 130 includes a facing edge portion 131, a support edge portion 132, a first lateral support edge portion 133, and a second lateral support edge portion 134. The facing edge portion 131 faces the free edge portion 122. The support edge portion 132 is located on the opposite side from the facing edge portion 131 in the extension direction of the cantilever portion 120. In this preferred embodiment, looking in the axial direction of the center axis, the support edge portion 132 is positioned so as to be parallel to the facing edge portion 131, but the support edge portion 132 may instead be positioned so as to intersect the facing edge portion 131. Furthermore, in this preferred embodiment, looking in the axial direction of the center axis, the length of the support edge portion 132 is the same or substantially the same as the length of the facing edge portion 131, but the length of the support edge portion 132 may instead be larger or smaller than the length of the facing edge portion 131.

The first lateral support edge portion 133 connects one end of the facing edge portion 131 to the support edge portion 132 when viewed in the axial direction of the center axis. In this preferred embodiment, the first lateral support edge portion 133 connects one end of the facing edge portion 131 to one end of the support edge portion 132. The second lateral support edge portion 134 connects the other end of the facing edge portion 131 to the support edge portion 132 when viewed in the axial direction of the center axis. In this preferred embodiment, the second lateral support edge portion 134 connects the other end of the facing edge portion 131 to the other end of the support edge portion 132.

In this preferred embodiment, the first lateral support edge portion 133 and the second lateral support edge portion 134 each extend along the extension direction of the cantilever portion 120. The first lateral support edge portion 133 and the second lateral support edge portion 134 may instead be each positioned so as to extend along a direction that intersects the extension direction of the cantilever portion 120. In addition, in this preferred embodiment, looking in the axial direction of the center axis, the first lateral support edge portion 133 and the second lateral support edge portion 134 each have a straight shape, but may include a portion that is curved or the entirety thereof may be curved. In this preferred embodiment, looking in the axial direction of the center axis, the length of each of the first lateral support edge portion 133 and the second lateral support edge portion 134 is smaller than the length of the facing edge portion 131 and smaller than the length of the support edge portion 132.

The plate-shaped portion 130 is connected to the inner surface 111 at at least a portion of the support edge portion 132, at least a portion of the first lateral support edge portion 133, and at least a portion of the second lateral support edge portion 134. A slit may be provided as a result of the base portion 110 and the plate-shaped portion 130 being separated from each other in portions where the support edge portion 132, the first lateral support edge portion 133, and the second lateral support edge portion 134 are not connected to the inner surface 111 of the base portion 110. In this preferred embodiment, specifically, the plate-shaped portion 130 is connected to the inner surface 111 along the whole of the support edge portion 132, the whole of the first lateral support edge portion 133, and the whole of the second lateral support edge portion 134.

From the viewpoint of increasing the bending rigidity of the plate-shaped portion 130, looking in the axial direction of the center axis, the total length of the portions where the support edge portion 132, the first lateral support edge portion 133, and the second lateral support edge portion 134 are connected to the inner surface 111 of the base portion 110 is preferably as large as possible. In this preferred embodiment, looking in the axial direction of the center axis, the total length of the portions of the support edge portion 132, the first lateral support edge portion 133, and the second lateral support edge portion 134 connected to the inner surface 111 of the base portion 110 is larger than the total length of the facing edge portion 131 and the portions of the support edge portion 132, the first lateral support edge portion 133, and the second lateral support edge portion 134 that are not connected to the inner surface 111 of the base portion 110.

In this preferred embodiment, the plate-shaped portion 130 has a rectangular outer shape when viewed in the axial direction of the center axis, but the outer shape when viewed in this direction is not particularly limited. Furthermore, from the viewpoint of increasing the bending rigidity of the plate-shaped portion 130, the thickness of the plate-shaped portion 130 in the axial direction of the center axis is preferably as large as possible.

A slit 102 is located between the base portion 110 and the portions of the cantilever portion 120 facing the base portion 110 other than the fixed edge portion 121 and between the facing edge portion 131 and the free edge portion 122. The narrower the slit 102 is, the more the device characteristics of the piezoelectric device 100 are improved. For example, as described later, in the case where the piezoelectric device 100 is used as an ultrasonic transducer, the smaller the width of the slit 102, the greater the degree to which force applied by the cantilever portion 120 to the medium located around the cantilever portion 120 or the greater the degree to which force received by the cantilever portion 120 from the medium can be prevented from escaping from the slit 102. The slit width of the slit 102 is, for example, preferably less than or equal to about 10 μm and more preferably less than or equal to about 1 μm.

The specific portions of the plate-shaped portion 130 are not particularly limited, but in this preferred embodiment, the plate-shaped portion 130 includes the piezoelectric layer 10 and the support layer 40, similarly to the cantilever portion 120. In other words, in this preferred embodiment, the plate-shaped portion 130 does not include the first electrode layer or the second electrode layer, which face each other with the piezoelectric layer 10 interposed therebetween.

Next, the portions of the base portion 110 will be described. As illustrated in FIGS. 1 and 3, similarly to the cantilever portion 120, the base portion 110 includes the piezoelectric layer 10, the first electrode layer 20, the second electrode layer 30, and the support layer 40. The base portion 110 further includes a substrate layer 50, a first connection electrode layer 60, and a second connection electrode layer 70.

The substrate layer 50 is connected to the second surface 113 side of the support layer 40 in the axial direction of the center axis. The substrate layer 50 includes a first substrate layer 51 and a second substrate layer 52 stacked on the second surface 113 side of the first substrate layer 51 in the axial direction of the center axis. In this preferred embodiment, the first substrate layer 51 includes $SiO_2$ and the second substrate layer 52 includes single crystal Si.

As illustrated in FIGS. 2 and 3, the first connection electrode layer 60 is electrically connected to the first electrode layer 20 via an adhesive layer, which is not illustrated, and exposed to the outside. Specifically, the first connection electrode layer 60 is disposed on the opposite side of the first electrode layer 20 from the side near the piezoelectric layer 10 in the base portion 110.

The second connection electrode layer 70 is electrically connected to the second electrode layer 30 via an adhesive layer, which is not illustrated, and exposed to the outside. Specifically, the second connection electrode layer 70 is disposed on the opposite side of the second electrode layer 30 from the side near the support layer 40 in the base portion 110.

The thickness of each of the first connection electrode layer 60 and the second connection electrode layer 70 is, for example, from about 0.1 μm to about 1.0 μm. The thickness of each of the adhesive layer connected to the first connection electrode layer 60 and the adhesive layer connected to the second connection electrode layer 70 is, for example, from about 0.005 μm to about 0.1 μm.

In this preferred embodiment, the first connection electrode layer 60 and the second connection electrode layer 70 are made of Au. The first connection electrode layer 60 and the second connection electrode layer 70 may be made of another electrically conductive material such as Al. The adhesive layer connected to the first connection electrode layer 60 and the adhesive layer connected to the second connection electrode layer 70 are, for example, made of Ti. The adhesive layers may be made of NiCr.

In this preferred embodiment, the piezoelectric layer 10, the first electrode layer 20, and the second electrode layer 30, and the support layer 40 of the base portion 110 are configured to be respectively continuous with the piezoelectric layer 10, the first electrode layer 20, the second electrode layer 30, and the support layer 40 of the cantilever portion 120. The piezoelectric layer 10 and the support layer 40 of the base portion 110 are configured to be respectively continuous with the piezoelectric layer 10 and the support layer 40 of the plate-shaped portion 130.

In the piezoelectric device 100 according to this preferred embodiment, an opening 101 is provided to open towards the second surface 113 side of the base portion 110. The opening 101 is a space surrounded by the base portion 110, the cantilever portion 120, the plate-shaped portion 130, and the slit 102.

As illustrated in FIG. 1, the mounting substrate 140 is connected to the second surface 113 across the entirety of the second surface 113. The mounting substrate 140 includes a first through hole 141.

The first through hole 141 penetrates through the mounting substrate 140 from the side near the base portion 110 to the opposite side from the base portion 110. The first through hole 141 faces at least one out of the cantilever portion 120 and the plate-shaped portion 130 in the axial direction of the center axis.

The thickness of the mounting substrate 140 is, for example, from about 0.1 mm to about 0.3 mm. The length of the first through hole 141 is, for example, from about 0.1 mm to about 0.3 mm. Looking in the axial direction of the center axis, an opening plane 142 of the first through hole 141 on the side near the base portion 110 is preferably located inward from the outer shape of the opening 101. Furthermore, in this preferred embodiment, a cross section of the first through hole 141 has a circular outer shape. The diameter of the circular cross section of the first through hole 141 is preferably greater than about 0.3 mm from the viewpoint of reducing or preventing energy loss of ultrasonic waves caused by the viscous resistance of the medium inside the first through hole 141.

As illustrated in FIG. 1, the casing 150 is at least located on the opposite side of the mounting substrate 140 from the side near the base portion 110. In this preferred embodiment, the casing 150 is positioned so as to accommodate the base portion 110, the cantilever portion 120, the plate-shaped portion 130, and the mounting substrate 140. A portion of the casing 150 is illustrated in FIG. 1.

The casing 150 includes a second through hole 151. The second through hole 151 penetrates through the casing 150 from the side near the mounting substrate 140 to the opposite side from the mounting substrate 140. The second through hole 151 is connected to the first through hole 141.

The thickness of the portion of the casing 150 facing the mounting substrate 140 is, for example from about 0.5 mm to about 5.0 mm. The length of the second through hole 151 is, for example, from about 0.5 mm to about 5.0 mm. Furthermore, in this preferred embodiment, the cross-sectional area of the second through hole 151 has a circular outer shape. The diameter of the circular cross section of the second through hole 151 is preferably greater than about 0.3 mm from the viewpoint of reducing or preventing energy loss of ultrasonic waves caused by the viscous resistance of the medium inside the second through hole 151.

The piezoelectric device 100 according to this preferred embodiment further includes a cap 160. The cap 160 is provided on the mounting substrate 140. The cap 160 is spaced apart from and cover the base portion 110, the cantilever portion 120, and the plate-shaped portion 130 on the opposite side from the side where the mounting substrate 140 is located. In this preferred embodiment, the cap 160 is also accommodated by the casing 150.

Figure 5:
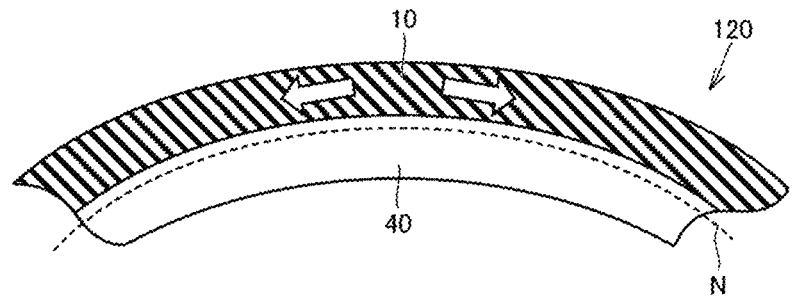
FIG. 5 is a sectional view schematically illustrating a portion of the cantilever portion when the piezoelectric device according to Preferred Embodiment 1 of the present invention is driven.

Next, the mechanism by which the cantilever portion 120 vibrates in the piezoelectric device 100 according to Preferred Embodiment 1 of the present invention will be described. FIG. 4 is a sectional view schematically illustrating a portion of the cantilever portion of the piezoelectric device according to Preferred Embodiment 1 of the present invention. FIG. 5 is a sectional view schematically illustrating a portion of the cantilever portion when the piezoelectric device according to Preferred Embodiment 1 of the present invention is driven. Note that the first electrode layer 20 and the second electrode layer 30 are not illustrated in FIGS. 4 and 5.

As illustrated in FIGS. 4 and 5, in this preferred embodiment, in the cantilever portion 120, the piezoelectric layer 10 functions as an expandable layer that can expand and contract in an in-plane direction of a plane perpendicular to the axial direction of the center axis and a layer other than the piezoelectric layer 10 functions as a constraining layer. In this preferred embodiment, mainly, the support layer 40 functions as a constraining layer. Thus, a constraining layer is stacked relative to an expandable layer in a direction perpendicular to the expansion-contraction direction of the expandable layer. Note that the cantilever portion 120 may include, instead of a constraining layer, an opposite-direction expandable layer that can contract in the in-plane direction when the expandable layer expands in the in-plane direction and expand in the in-plane direction when the expandable layer contracts in the in-plane direction.

When the piezoelectric layer 10, which is the expandable layer, attempts to expand or contract in the in-plane direction of a plane S, the support layer 40, which defines the main portion of the constraining layer, constrains the expansion or contraction of the piezoelectric layer 10 at the plane where the support layer 40 is bonded to the piezoelectric layer 10. Furthermore, in this preferred embodiment, the piezoelectric layer 10, which is the expandable layer, is located only on one side of a stress neutral plane N in the cantilever portion 120. The position of the center of gravity of the support layer 40, which defines the majority of the constraining layer, is located on the other side of the stress neutral plane N. As a result, as illustrated in FIGS. 4 and 5, the cantilever portion 120 bends in a direction perpendicular to the plane when the piezoelectric layer 10, which is the expandable layer, expands and contracts in the in-plane direction in the plane. The amount of displacement of the cantilever portion 120 when the cantilever portion 120 bends increases with increasing separation distance between the stress neutral plane N and the piezoelectric layer 10. Furthermore, the amount of displacement increases as the stress generated when the piezoelectric layer 10 attempts to expand or contract increases. Thus, the cantilever portion 120 undergoes bending vibration starting at the fixed edge portion 121 illustrated in FIGS. 1 to 3 in a direction perpendicular to the plane.

Figure 6:
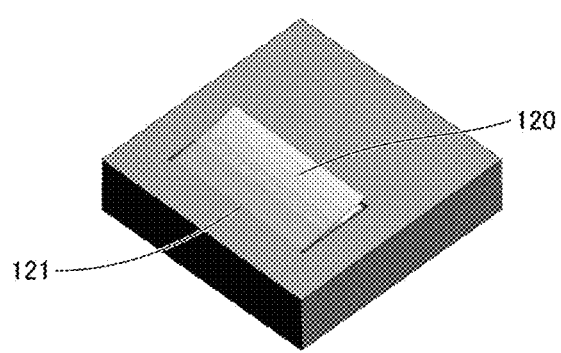
FIG. 6 is a perspective view of the piezoelectric device according to Preferred Embodiment 1 of the present invention illustrating a state in which the piezoelectric device is vibrating in a fundamental vibration mode, as seen from one side, according to a simulation.
Figure 7:
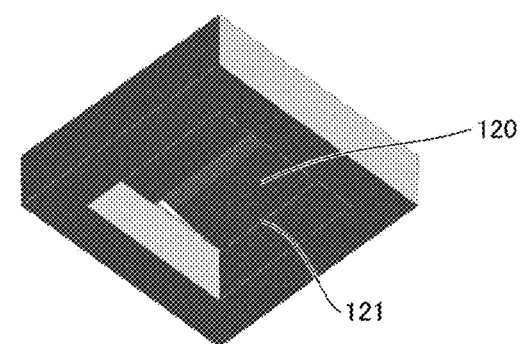
FIG. 7 is a perspective view of the piezoelectric device according to Preferred Embodiment 1 of the present invention illustrating a state in which the piezoelectric device is vibrating in a fundamental vibration mode, as seen from the other side, according to a simulation.

FIG. 6 is a perspective view of the piezoelectric device according to Preferred Embodiment 1 of the present invention illustrating a state in which the piezoelectric device is vibrating in a fundamental vibration mode, as seen from one side, according to a simulation. FIG. 7 is a perspective view of the piezoelectric device according to Preferred Embodiment 1 of the present invention illustrating a state in which the piezoelectric device is vibrating in a fundamental vibration mode, as seen from the other side, according to a simulation. As illustrated in FIGS. 6 and 7, the cantilever portion 120 undergoes bending vibration starting at the fixed edge portion 121 in a direction perpendicular to the plane.

The piezoelectric device 100 according to this preferred embodiment has improved device characteristics particularly when used as an ultrasonic transducer. Hereafter, the function of the piezoelectric device 100 according to this preferred embodiment when the piezoelectric device 100 is used as an ultrasonic transducer will be described.

First, as illustrated in FIGS. 1 to 3, when ultrasonic waves are to be generated by the piezoelectric device 100 according to this preferred embodiment, a voltage is applied between the first connection electrode layer 60 and the second connection electrode layer 70. Then, as illustrated in FIGS. 1 and 2, a voltage is applied between the first electrode layer 20 connected to the first connection electrode layer 60 and the second electrode layer 30 connected to the second connection electrode layer 70. Therefore, a voltage is applied between the first electrode layer 20 and the second electrode layer 30, which face each other across the piezoelectric layer 10, in the cantilever portion 120 as well. As a result, the piezoelectric layer 10 expands and contracts in the in-plane direction of the plane, and therefore the cantilever portion 120 undergoes bending vibration in a direction perpendicular to the plane through the above-described mechanism. Thus, a force is applied to the medium around the piezoelectric device 100, this medium also vibrates, and as a result, ultrasonic waves are generated. In this preferred embodiment, the ultrasonic waves are transmitted to outside the casing 150 via the opening 101, the first through hole 141, and the second through hole 151.

In addition, in the piezoelectric device 100 according to this preferred embodiment, the cantilever portion 120 has an intrinsic mechanical resonant frequency. Therefore, when the applied voltage is a sinusoidal voltage and the frequency of the sinusoidal voltage is close to the value of the resonant frequency, the amount of displacement will be large when the cantilever portion 120 bends.

In the case where ultrasonic waves are to be detected by the piezoelectric device 100, ultrasonic waves that enter the opening 101 via the second through hole 151 and the first through hole 141 from outside the casing 150 are detected. The ultrasonic waves entering the opening 101 cause the medium around the cantilever portion 120 to vibrate, a force is applied to the cantilever portion 120 from the medium around the cantilever portion 120, and the cantilever portion 120 undergoes bending vibration. When the cantilever portion 120 undergoes bending vibration, stress acts on the piezoelectric layer 10. Electric charge is induced inside the piezoelectric layer 10 by the stress acting on the piezoelectric layer 10. A potential difference is generated between the first electrode layer 20 and the second electrode layer 30, which face each other across the piezoelectric layer 10, by the electric charge induced in the piezoelectric layer 10. This potential difference is detected using the first connection electrode layer 60 connected to the first electrode layer 20 and the second connection electrode layer 70 connected to the second electrode layer 30. Thus, ultrasonic waves can be detected in the piezoelectric device 100.

Furthermore, if the ultrasonic waves to be detected contain a large specific frequency component and this frequency component is close to the value of the resonant frequency, the amount of displacement will be large when the cantilever portion 120 undergoes bending vibration. The potential difference increases as the amount of displacement increases.

Thus, in the case where the piezoelectric device 100 according to this preferred embodiment is to be used as an ultrasonic transducer, the resonant frequency of the cantilever portion 120 is important.

The resonant frequency of the cantilever portion 120 changes when the length of the cantilever portion 120 in the extension direction thereof is changed. However, in the piezoelectric device 100 according to this preferred embodiment, the resonant frequency of the medium around the cantilever portion 120 can be easily controlled by increasing the volume of the space on the side near the opening 101 and so on by providing the plate-shaped portion 130 while designing the cantilever portion 120 so that the desired resonant frequency can be obtained.

Figure 8:
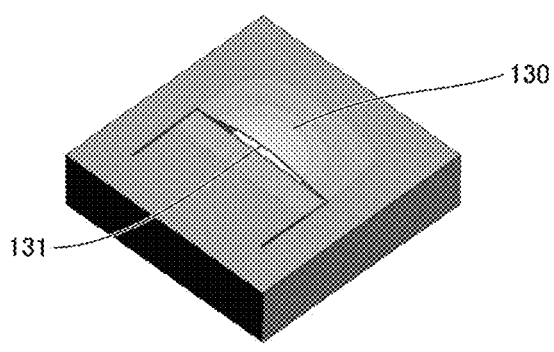
FIG. 8 is a perspective view of the piezoelectric device according to Preferred Embodiment 1 of the present invention illustrating a state in which a plate-shaped portion is vibrating in a fundamental vibration mode according to a simulation.

Note that the plate-shaped portion 130 may vibrate together with the vibration of the cantilever portion 120. In this preferred embodiment, the plate-shaped portion 130 has a fundamental vibration mode that is different from that of the cantilever portion 120. FIG. 8 is a perspective view of the piezoelectric device according to Preferred Embodiment 1 of the present invention illustrating a state in which the plate-shaped portion is vibrating in a fundamental vibration mode according to a simulation. As illustrated in FIG. 8, the plate-shaped portion 130 vibrates so as to be maximally displaced in the vicinity of the center of the facing edge portion 131.

There is preferably a large difference between the resonant frequency of the fundamental vibration mode of the plate-shaped portion 130 and the resonant frequency of the fundamental vibration mode of the cantilever portion 120. The larger the difference between the resonant frequency of the fundamental vibration mode of the plate-shaped portion 130 and the resonant frequency of the fundamental vibration mode of the cantilever portion 120, the more stable the operation of the piezoelectric device 100 and the better the device characteristics. From the viewpoint of increasing the difference between the value of the resonant frequency of the fundamental vibration mode of the plate-shaped portion 130 and the value of the resonant frequency of the fundamental vibration mode of the cantilever portion 120, the area of the plate-shaped portion 130 is preferably as small as possible while ensuring that the volume of the space on the side near the opening 101 is a desired volume.

From the above viewpoint, for example, in the case where the resonant frequency of the cantilever portion 120 of the piezoelectric device 100 according to Preferred Embodiment 1 of the present invention is designed to be in the vicinity of about 40 kHz, first, the cantilever portion 120 is preferably designed so that the constituent material of the piezoelectric layer 10 is lithium niobate, the thickness of the piezoelectric layer 10 is about 1 μm, the thickness of each of the first electrode layer 20 and the second electrode layer 30 is about 0.1 μm, the thickness of the first support layer 41 is about 0.8 μm, the thickness of the second support layer 42 is about 3.8 μm, and the shortest distance from the fixed edge portion 121 of the cantilever portion 120 to the free edge portion 122 of the cantilever portion 120 is about 400 μm. It is preferable that the length of each of the fixed edge portion 121 and the free edge portion 122 be about 800 μm, for example.

With respect to the cantilever portion 120 designed as described above, the plate-shaped portion 130 is, for example, preferably designed so that the thickness of the piezoelectric layer is about 1 μm, the thickness of the first support layer 41 is about 0.8 μm, the thickness of the second support layer 42 is about 3.8 μm, the length of the facing edge portion 131 is about 800 μm, and the length of the plate-shaped portion 130 in the extension direction of the cantilever portion 120 is about 400 μm. This enables the volume of the space on side near the opening 101 to be increased by providing the plate-shaped portion 130 having sufficiently high bending rigidity with respect to the cantilever portion 120. Furthermore, the bending rigidity of the plate-shaped portion 130 is sufficiently high as result of being designed as described above. Furthermore, as a result of being designed as described above, the value of the resonant frequency of the fundamental vibration mode of the plate-shaped portion 130 is greater than or equal to twice the value of the resonant frequency of the fundamental vibration mode of the cantilever portion 120, and the difference between the values of these resonant frequencies is sufficiently large. Consequently, the device characteristics of the piezoelectric device 100 are improved.

Next, the functions of the opening 101, the first through hole 141, and the second through hole 151 of the piezoelectric device 100 according to the present preferred embodiment of the present invention will be further described. As illustrated in FIG. 1, in this preferred embodiment, ultrasonic waves detected by the cantilever portion 120 of the piezoelectric device 100 or ultrasonic waves generated by the cantilever portion 120 of the piezoelectric device 100 can be made to undergo Helmholtz resonance in the opening 101, the first through hole 141, and the second through hole 151. The occurrence of Helmholtz resonance increases the bandwidth and the acoustic pressure width of ultrasonic waves that can be detected or generated by the piezoelectric device 100, and the detection sensitivity of the piezoelectric device 100 when ultrasonic waves are detected by the piezoelectric device 100 is improved. Consequently, the device characteristics of the piezoelectric device 100 are improved.

In order to generate Helmholtz resonance, the piezoelectric device 100 is preferably designed to that the resonant frequency of Helmholtz resonance is close to the frequency of ultrasonic waves detected or generated by the piezoelectric device 100. For example, a resonant frequency f can be adjusted on the basis of Formula (1), described below, where c is the acoustic velocity in the atmosphere, S is the average cross-sectional area of the first through hole 141 and the second through hole 151, V is the volume of the opening 101, L is the total length of the first through hole 141 and the second through hole 151, and R is the average value of the radii of the circular cross sections of the first through hole 141 and the second through hole 151, and the opening edge correction value is about 1.7. In other words, the piezoelectric device 100 is preferably designed by adjusting the size of the plate-shaped portion 130 on the basis of below Formula (1)

$$f = \frac{c}{2\pi} \sqrt{\frac{S}{V(L + 1.7R)}} \,. \tag{1}$$

For example, if the opening 101, when viewed in the axial direction of the center axis, has a rectangular shape with a lateral direction length of about 0.8 mm and a longitudinal direction length of about 0.8 mm, the depth of the opening 101 in the axial direction of the center axis is about 0.3 mm, the length of the first through hole 141 is about 0.2 mm, the length of the second through hole 151 is about 1.0 mm, and the average value of the radii of the circular cross sections of the first through hole 141 and the second through hole 151 is about 0.4 mm, the resonant frequency will be about 35.2 kHz, which is relatively close to about 40 kHz, according to Formula (1). As a result, when ultrasonic waves with a resonant frequency of about 40 kHz are generated or detected by the piezoelectric device 100, the ultrasonic waves can be made to undergo Helmholtz resonance.

As described above, for example, if the piezoelectric device 100 is designed so that the resonant frequency of the cantilever portion 120 is about 40 kHz and the resonant frequency of Helmholtz resonance generated by the opening 101, the first through hole 141, and the second through hole 151 is about 35.2 kHz, when ultrasonic waves having a frequency of around 40 kHz are generated or detected by the piezoelectric device 100, vibration of the medium around the cantilever portion 120, that is, the medium on the side near the opening 101 is amplified and the device characteristics of the piezoelectric device 100 can be improved.

Figure 9:
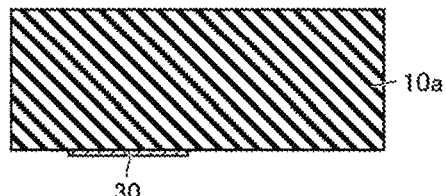
FIG. 9 is a sectional view illustrating a state in which a second electrode layer is provided on a piezoelectric single crystal substrate in a method of manufacturing the piezoelectric device according to Preferred Embodiment 1 of the present invention.

Hereafter, a method of manufacturing the piezoelectric device 100 according to Preferred Embodiment 1 of the present invention will be described. FIG. 9 is a sectional view illustrating a state in which a second electrode layer is provided on a piezoelectric single crystal substrate in the method of manufacturing the piezoelectric device according to Preferred Embodiment 1 of the present invention. In FIG. 9 and FIGS. 10 to 14 described later, the same cross-sectional view as in FIG. 1 is illustrated.

As illustrated in FIG. 9, first, an adhesive layer, which is not illustrated, is provided on the lower surface of a piezoelectric single crystal substrate 10a, and then the second electrode layer 30 is provided on the opposite side of the adhesive layer from the side near the piezoelectric single crystal substrate 10a. The second electrode layer 30 is formed so as to have a desired pattern using a vapor deposition lift off method. The second electrode layer 30 may instead be formed by being stacked so as to extend across the entire lower surface of the piezoelectric single crystal substrate 10a using sputtering and then formed into a desired pattern using an etching method. The second electrode layer 30 and the adhesive layer may be epitaxially grown.

Figure 10:
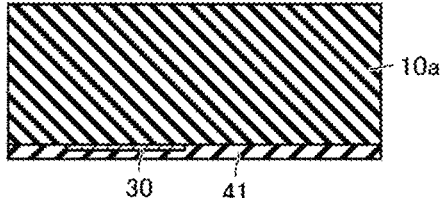
FIG. 10 is a sectional view illustrating a state in which a first support layer is provided in the method of manufacturing the piezoelectric device according to Preferred Embodiment 1 of the present invention.

FIG. 10 is a sectional view illustrating a state in which the first support layer is provided in the method of manufacturing the piezoelectric device according to Preferred Embodiment 1 of the present invention. As illustrated in FIG. 10, the first support layer 41 is provided on the lower surfaces of the piezoelectric single crystal substrate 10a and the second electrode layer 30 using a chemical vapor deposition (CVD) method or a physical vapor deposition (PVD) method. Immediately after the first support layer 41 is provided, out of the lower surface of the first support layer 41, the portion of the lower surface of the first support layer 41 located on the opposite side from the second electrode layer 30 is raised up. Therefore, the lower surface of the first support layer 41 is ground down and planarized by performing chemical mechanical polishing (CMP).

Figure 11:
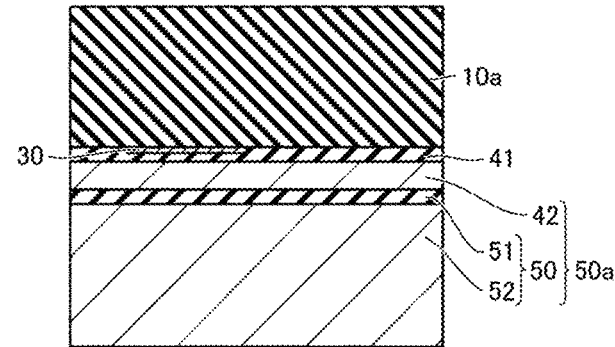
FIG. 11 is a sectional view illustrating a state in which a multilayer body is bonded to the first support layer in the method of manufacturing the piezoelectric device according to Preferred Embodiment 1 of the present invention.

FIG. 11 is a sectional view illustrating a state in which a multilayer body is bonded to the first support layer in the method of manufacturing the piezoelectric device according to Preferred Embodiment 1 of the present invention. As illustrated in FIG. 11, a multilayer body 50a including the second support layer 42 and the substrate layer 50 is bonded to the lower surface of the first support layer 41 using surface activated bonding or atomic diffusion bonding. In this preferred embodiment, the multilayer body 50a is a silicon-on-insulator (SOI) substrate. The yield of the piezoelectric device 100 can be improved by planarizing the top surface of the second support layer 42 by performing CMP in advance.

FIG. 12 is a sectional view illustrating a state in which the piezoelectric single crystal substrate is ground down to form a piezoelectric layer in the method of manufacturing the piezoelectric device according to Preferred Embodiment 1 of the present invention. As illustrated in FIGS. 11 and 12, the piezoelectric single crystal substrate 10a is made thinner by grinding down the upper surface of the piezoelectric single crystal substrate 10a using a grinder. The upper surface of the thinned piezoelectric single crystal substrate 10a is further polished using CMP or another method in order to form the piezoelectric single crystal substrate 10a into the piezoelectric layer 10.

The piezoelectric single crystal substrate 10a may be formed into the piezoelectric layer 10 by forming a release layer on the upper surface side of the piezoelectric single crystal substrate 10a by implanting ions in advance, and then peeling off the release layer. Furthermore, the upper surface of the piezoelectric single crystal substrate 10a once the release layer has been peeled off may be further polished using CMP or another method in order to form the piezoelectric single crystal substrate 10a into the piezoelectric layer 10.

FIG. 13 is a sectional view illustrating a state in which the first electrode layer is provided on the piezoelectric layer in the method of manufacturing the piezoelectric device according to Preferred Embodiment 1 of the present invention. As illustrated in FIG. 13, an adhesive layer, which is not illustrated, is provided on the upper surface of the piezoelectric layer 10, and then the first electrode layer 20 is provided on the opposite side of the adhesive layer from the side near the piezoelectric layer 10. The first electrode layer 20 is formed so as to have a desired pattern using a vapor deposition lift off method. The first electrode layer 20 may instead be formed by being stacked so as to extend across the entire upper surface of the piezoelectric layer 10 using sputtering and then formed into a desired pattern using an etching method. The piezoelectric layer 10 and the adhesive layers may be epitaxially grown.

FIG. 14 is a sectional view illustrating a state in which a slit extending from the opposite side of the piezoelectric layer from the side near the support layer up to the upper surface of the substrate layer is formed in the method of manufacturing the piezoelectric device according to Preferred Embodiment 1 of the present invention. FIG. 15 is a sectional view illustrating a state in which a through hole extending from the opposite side of the piezoelectric layer from the side near the support layer up to the upper surface of the second electrode layer is formed in the method of manufacturing the piezoelectric device according to Preferred Embodiment 1 of the present invention. The same cross-sectional view as in FIG. 3 is illustrated in FIG. 15.

As illustrated in FIG. 14, the slit is formed in the piezoelectric layer 10 and the first support layer 41 by performing dry etching using reactive ion etching (RIE). The slit may instead be formed using wet etching using nitric hydrofluoric acid or the like. In addition, the second support layer 42 exposed in the slit is subjected to etching so that the slit reaches the upper surface of the substrate layer 50 by performing deep reactive ion etching (DRIE). Thus, the slit 102 located between the free edge portion 122 and the facing edge portion 131 is formed.

Furthermore, as illustrated in FIG. 15, the piezoelectric layer 10 is etched so that a portion of the second electrode layer 30 is exposed therethrough by performing dry etching or wet etching in the portion corresponding to the base portion 110 illustrated in FIG. 3.

Then, as illustrated in FIGS. 15 and 3, adhesive layers, which are not illustrated, are provided on the first electrode layer 20 and the second electrode layer 30 in the portion corresponding to the base portion 110, and then the first connection electrode layer 60 and the second connection electrode layer 70 are provided on the upper surfaces of the adhesive layers using a vapor deposition lift off method. The first connection electrode layer 60 and the second connection electrode layer 70 may be formed by being stacked across the entirety of the piezoelectric layer 10, the first electrode layer 20 and the exposed second electrode layer 30 using sputtering, and then being formed into desired patterns using an etching method.

Furthermore, as illustrated in FIGS. 14 and 1, a portion of the substrate layer 50 is removed using DRIE. Thus, the base portion 110, the cantilever portion 120, the plate-shaped portion 130, and the opening 101 are formed. Finally, the mounting substrate 140 is mounted on the second surface 113 side of the base portion 110 and the cap 160 is provided, and then the base portion 110, the cantilever portion 120, the plate-shaped portion 130, the mounting substrate 140, and the cap 160 are accommodated inside the casing 150. Through the above-described steps, the piezoelectric device 100 according to Preferred Embodiment 1 of the present invention illustrated in FIG. 1 is manufactured.

As described above, the piezoelectric device 100 according to Preferred Embodiment 1 of the present invention includes the base portion 110, only one cantilever portion 120, and the plate-shaped portion 130. The base portion 110 has an annular shape and includes the inner surface 111, the first surface 112, and the second surface 113. The inner surface 111 is located on an inner side of the annular shape. The first surface 112 is located on one side in an axial direction of the center axis of the annular shape. The second surface 113 is located on the opposite side in the axial direction from the first surface 112. The cantilever portion 120 is connected to a portion of the inner surface 111 of the base portion 110 at a position separated from the second surface 113. The cantilever portion 120 extends in an in-plane direction that intersects an axial direction of the center axis. The cantilever portion 120 includes the fixed edge portion 121 and the free edge portion 122. The fixed edge portion 121 is connected to the inner surface 111. The free edge portion 122 is located on the opposite side of the cantilever portion 120 from the side where the fixed edge portion 121 is located in the extension direction of the cantilever portion 120. The cantilever portion 120 includes the piezoelectric layer 10, the first electrode layer 20, and the second electrode layer 30. The first electrode layer 20 is disposed on one side of the piezoelectric layer 10 in the axial direction of the center axis. The second electrode layer 30 is disposed so as to face at least a portion of the first electrode layer 20 across the piezoelectric layer 10. The plate-shaped portion 130 is connected to another portion of the inner surface 111 of the base portion 110 at a position separated from the second surface 113. The plate-shaped portion 130 extends in the in-plane direction so as to face the cantilever portion 120 with a gap therebetween. The plate-shaped portion 130 includes the facing edge portion 131, the support edge portion 132, the first lateral support edge portion 133, and the second lateral support edge portion 134. The facing edge portion 131 faces the free edge portion 122. The support edge portion 132 is located on the opposite side from the facing edge portion 131 in the extension direction of the cantilever portion 120. The first lateral support edge portion 133 connects one end of the facing edge portion 131 to the support edge portion 132 when viewed in the axial direction of the center axis. The second lateral support edge portion 134 connects the other end of the facing edge portion 131 to the support edge portion 132 when viewed in the axial direction of the center axis. The plate-shaped portion 130 is connected to the inner surface 111 at at least a portion of the support edge portion 132, at least a portion of the first lateral support edge portion 133, and at least a portion of the second lateral support edge portion 134.

Thus, in the piezoelectric device 100 including only one cantilever portion 120, the resonant frequency of the medium around the cantilever portion 120 can be easily controlled while reducing or preventing changes in the resonant frequency of the cantilever portion 120.

In this preferred embodiment, looking in the axial direction of the center axis, the total length of the portions of the support edge portion 132, the first lateral support edge portion 133, and the second lateral support edge portion 134 that are connected to the inner surface 111 of the base portion 110 is larger than the total length of the facing edge portion 131 and the portions of the support edge portion 132, the first lateral support edge portion 133, and the second lateral support edge portion 134 that are not connected to the inner surface 111 of the base portion 110.

As a result, due to the plate-shaped portion 130 being more firmly supported, the frequency of the vibration mode of the plate-shaped portion 130 is higher and the difference between the frequency of the vibration mode of the plate-shaped portion 130 and the frequency of the vibration mode of the cantilever portion 120 is larger, and therefore the effect of vibration of the plate-shaped portion 130 on vibration of the cantilever portion 120 is reduced and the cantilever portion 120 can be made to vibrate in a stable manner.

In this preferred embodiment, the area of the plate-shaped portion 130 is greater than or equal to about 10% of the area of the cantilever portion 120 when viewed in the axial direction of the center axis.

This enables a space in which to allow the vibration of the medium to undergo resonance to be secured on the side of the plate-shaped portion 130 near the opening 101.

In this preferred embodiment, the area of the plate-shaped portion 130 is less than or equal to the area of the cantilever portion 120 when viewed in the axial direction of the center axis.

As a result, a reduction in the frequency of the vibration mode of the plate-shaped portion 130 due to the area of the plate-shaped portion 130 being small can be reduced or prevented, and therefore a reduction in the difference between the frequency of the vibration mode of the plate-shaped portion 130 and the frequency of the vibration mode of the cantilever portion 120 can be prevented. Consequently, this makes it possible to prevent the vibration of the plate-shaped portion 130 from greatly affecting the vibration of the cantilever portion 120.

The piezoelectric device 100 according to this preferred embodiment further includes the mounting substrate 140. The mounting substrate 140 is connected to the second surface 113 across the entirety of the second surface 113. The mounting substrate 140 includes the first through hole 141. The first through hole 141 penetrates through the mounting substrate 140 from the side near the base portion 110 to the opposite side from the base portion 110. The first through hole 141 faces at least one out of the cantilever portion 120 and the plate-shaped portion 130 in the axial direction of the center axis.

This enables the medium located inside the first through hole 141 to be utilized in resonance of the vibration of the medium.

The piezoelectric device 100 according to this preferred embodiment further includes the casing 150. The casing 150 is at least located on the opposite side of the mounting substrate 140 from the side near the base portion 110. The casing 150 includes the second through hole 151. The second through hole 151 penetrates through the casing 150 from the side near the mounting substrate 140 to the opposite side from the mounting substrate 140. The second through hole 151 is connected to the first through hole 141.

This enables the medium located inside the second through hole 151 to be utilized in resonance of the vibration of the medium.

Preferred Embodiment 2

Hereafter, a piezoelectric device according to Preferred Embodiment 2 of the present invention will be described. The position of the first through hole is different in the piezoelectric device according to Preferred Embodiment 2 of the present invention compared to the piezoelectric device 100 according to Preferred Embodiment 1 of the present invention. Therefore, description of the portions of the configuration that are the same as in the piezoelectric device according to Preferred Embodiment 1 of the present invention will not be repeated.

Figure 16:
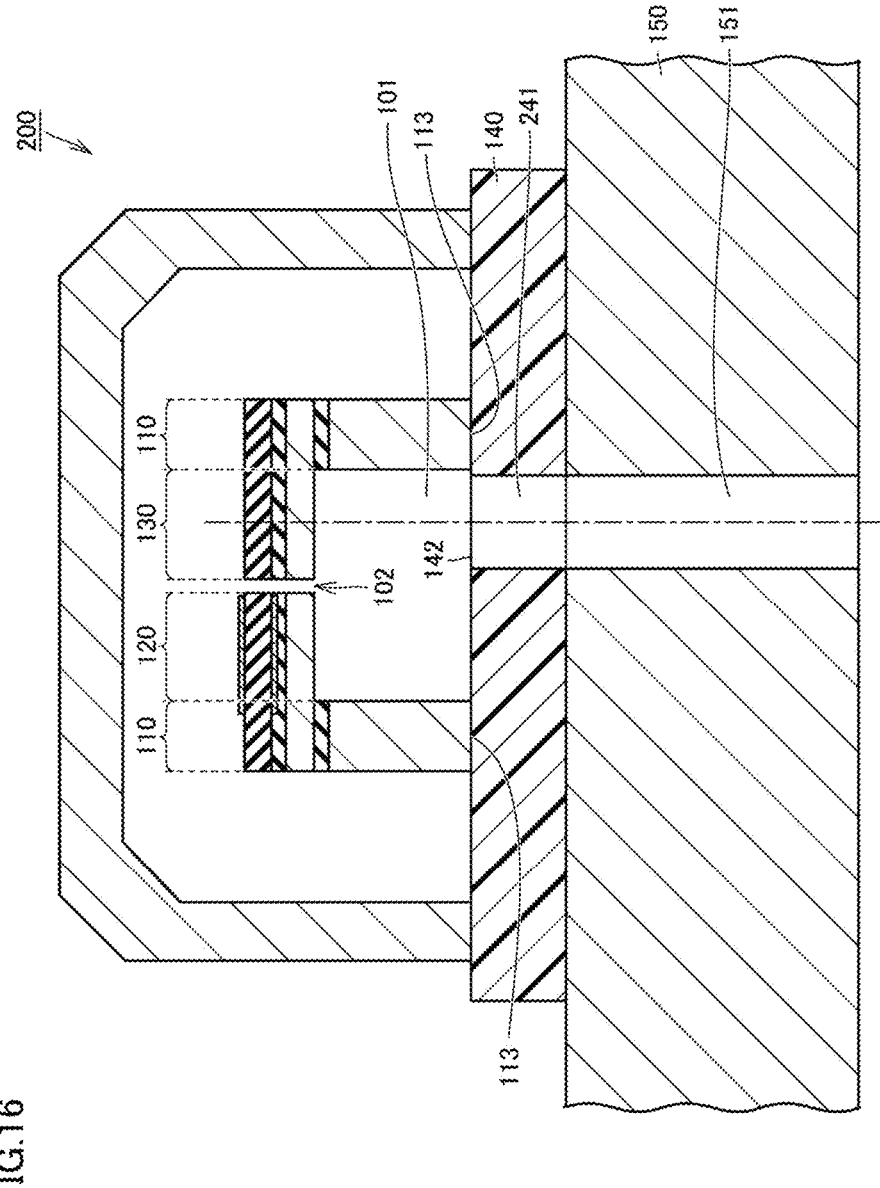
FIG. 16 is a sectional view illustrating a piezoelectric device according to Preferred Embodiment 2 of the present invention.

FIG. 16 is a sectional view illustrating the piezoelectric device according to Preferred Embodiment 2 of the present invention. In FIG. 16, the same cross-sectional view as that of the piezoelectric device 100 of Preferred Embodiment 1 of the present invention illustrated in FIG. 1 is illustrated.

As illustrated in FIG. 16, in a piezoelectric device 200 according to Preferred Embodiment 2 of the present invention, looking in the axial direction of the center axis, a region of an opening plane 142, on the side near the base portion 110, of a first through hole 241 that overlaps the plate-shaped portion 130 occupies at least about 50% of the area of the opening plane 142. As result, the probability of particles entering the piezoelectric device 200 from the outside through the first through hole 241 and sticking to the cantilever portion 120 can be reduced. This in turn improves the reliability of the piezoelectric device 200.

In addition, in this preferred embodiment, looking in the axial direction of the center axis, the center of the opening plane 142, on the side near the base portion 110, of the first through hole 241 overlaps the plate-shaped portion 130. As result, the probability of particles entering the piezoelectric device 200 from the outside through the first through hole 241 and sticking to the cantilever portion 120 can be further reduced. This in turn further improves the reliability of the piezoelectric device 200.

Note that in the piezoelectric device 200 according to Preferred Embodiment 2 of the present invention as well, similarly to as in the piezoelectric device according to Preferred Embodiment of the present invention, the plate-shaped portion 130 is provided for the cantilever portion 120, and therefore the resonant frequency of the medium around the cantilever portion 120 can be easily controlled while reducing or preventing changes in the resonant frequency of the cantilever portion 120.

Configurations in the above description of the preferred embodiments that can be combined with each other may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:

a base portion including an annular shape and an inner surface located on an inner side of the annular shape, a first surface located on one side in an axial direction of a center axis of the annular shape, and a second surface located on an opposite side from a side where the first surface is located in the axial direction;

only one cantilever portion that is connected to a portion of the inner surface of the base portion at a position separated from the second surface and that extends in an in-plane direction that intersects the axial direction of the center axis; and a plate-shaped portion that is connected to another portion of the inner surface of the base portion at a position separated from the second surface and that extends along the in-plane direction so as to face the cantilever portion with a gap therebetween; wherein the cantilever portion includes a fixed edge portion connected to the inner surface and a free edge portion located on an opposite side from a side where the fixed edge portion is located in an extension direction of the cantilever portion;

the cantilever portion includes a piezoelectric layer, a first electrode layer provided on one side of the piezoelectric layer in the axial direction of the center axis, and a second electrode layer disposed so as to face at least a portion of the first electrode layer across the piezoelectric layer;

the plate-shaped portion includes a facing edge portion that faces the free edge portion, a support edge portion that is located on an opposite side from a side where the facing edge portion is located in the extension direction of the cantilever portion, a first lateral support edge portion that connects one end of the facing edge portion and the support edge portion to each other when viewed in the axial direction of the center axis, and a second lateral support edge portion that connects another end of the facing edge portion and the support edge portion to each other when viewed in the axial direction of the center axis; and the plate-shaped portion is connected to the inner surface at at least a portion of the support edge portion, at least a portion of the first lateral support edge portion, and at least a portion of the second lateral support edge portion.

2. The piezoelectric device according to claim 1, wherein looking in the axial direction of the center axis, a total length of portions of the support edge portion, the first lateral support edge portion, and the second lateral support edge portion that are connected to the inner surface of the base portion is larger than a total length of the facing edge portion and portions of the support edge portion, the first lateral support edge portion, and the second lateral support edge portion that are not connected to the inner surface of the base portion.

3. The piezoelectric device according to claim 1, wherein looking in the axial direction of the center axis, an area of the plate-shaped portion is at least about 10% of an area of the cantilever portion.

4. The piezoelectric device according to claim 1, wherein looking in the axial direction of the center axis, an area of the plate-shaped portion is less than or equal to an area of the cantilever portion.

5. The piezoelectric device according to claim 1, further comprising:

a mounting substrate that is connected to the second surface across an entirety of the second surface; wherein the mounting substrate includes a first through hole that penetrates through the mounting substrate from a side adjacent to the base portion to an opposite side from the side adjacent to the base portion; and the first through hole faces at least one out of the cantilever portion and the plate-shaped portion in the axial direction of the center axis.

6. The piezoelectric device according to claim 5, wherein looking in the axial direction of the center axis, a region of an opening plane, on a side where the base portion is located, of the first through hole that overlaps the plate-shaped portion occupies at least about 50% of an area of the opening plane.

7. The piezoelectric device according to claim 5, wherein looking in the axial direction of the center axis, a center of an opening plane, on a side where the base portion is located, of the first through hole overlaps the plate-shaped portion.

8. The piezoelectric device according to claim 5, further comprising:

a casing located at least on an opposite side of the mounting substrate from a side where the base portion is located wherein the casing includes a second through hole that penetrates through the casing from a side near the mounting substrate to an opposite side from the side near the mounting substrate; and the second through hole is connected to the first through hole.

9. The piezoelectric device according to claim 1, wherein the cantilever portion has an outer shape that is one of rectangular, triangular, trapezoidal, or semicircular when viewed in the axial direction of the center axis.

10. The piezoelectric device according to claim 1, wherein a maximum length of the cantilever portion is less than a length of the fixed edge portion when looking in the axial direction of the center axis and less than a length of the free edge portion when looking in the axial direction of the center axis.

11. The piezoelectric device according to claim 1, wherein a maximum length dimension of the cantilever portion is at least about five times or more a thickness dimension of the cantilever portion in the axial direction of the center axis.

12. The piezoelectric device according to claim 1, wherein the piezoelectric layer includes a single crystal rotated Y cut substrate with a cut angle of about 30° and a thickness of about 0.3 μm to about 5.0 μm.

13. The piezoelectric device according to claim 1, wherein piezoelectric layer is made of an alkali-niobate-based compound or an alkali-tantalate-based compound.

14. The piezoelectric device according to claim 1, wherein the first and second electrode layers are made of Pt or Al.

15. The piezoelectric device according to claim 1, further comprising adhesive layers between the piezoelectric layer and the first and second electrode layers, and the adhesive layers are made of Ti or NiCr.

16. The piezoelectric device according to claim 1, wherein a thickness of each of the first electrode layer and the second electrode layer is about 0.05 μm to about 0.2 μm.

17. The piezoelectric device according to claim 16, further comprising adhesive layers between the piezoelectric layer and the first and second electrode layers, wherein a thickness of each of the adhesive layers is about 0.005 μm to about 0.05 μm.

18. The piezoelectric device according to claim 1, wherein the cantilever portion includes a support layer.

19. The piezoelectric device according to claim 18, wherein the support layer is thicker than the piezoelectric layer.

* * * * *